US012615044B2

(12) United States Patent
Djelassi-Tscheck et al.

(10) Patent No.: US 12,615,044 B2
(45) Date of Patent: Apr. 28, 2026

(54) DRIVER CIRCUIT FOR CONTROLLING A SEMICONDUCTOR SWITCH

(71) Applicant: Infineon Technologies AG, Neubiberg (DE)

(72) Inventors: Christian Djelassi-Tscheck, Villach (AT); Benno Köppl, Markt Indersdorf (DE); Andre Mourrier, Manosque (FR); Mario Tripolt, Ferndorf (AT)

(73) Assignee: Infineon Technologies AG, Neubiberg (DE)

( * ) Notice: Subject to any disclaimer, the term of this patent is extended or adjusted under 35 U.S.C. 154(b) by 26 days.

(21) Appl. No.: 18/634,554

(22) Filed: Apr. 12, 2024

(65) Prior Publication Data

US 2024/0348244 A1 Oct. 17, 2024

(30) Foreign Application Priority Data

Apr. 14, 2023 (DE) .......................... 102023109447.5

(51) Int. Cl.
| | |
|---|---|
| *H03K 17/00* | (2006.01) |
| *H03K 17/0412* | (2006.01) |
| *H03K 17/10* | (2006.01) |
| *H03K 17/30* | (2006.01) |

(52) U.S. Cl.
CPC ..... *H03K 17/102* (2013.01); *H03K 17/04123* (2013.01); *H03K 17/302* (2013.01)

(58) Field of Classification Search
CPC .......... H03K 17/102; H03K 17/04123; H03K 17/302; H03K 17/145; H03K 17/6871
See application file for complete search history.

(56) References Cited

U.S. PATENT DOCUMENTS

| | | | | |
|---|---|---|---|---|
| 5,517,379 A | * | 5/1996 | Williams | H10D 30/603 |
| | | | | 361/84 |
| 10,018,664 B2 | * | 7/2018 | Yamamoto | G01R 31/327 |
| 11,004,626 B2 | * | 5/2021 | Tsukamoto | H02M 1/32 |
| 11,271,558 B2 | * | 3/2022 | Djelassi-Tscheck | |
| | | | | H03K 17/6877 |
| 11,699,995 B2 | * | 7/2023 | Garg | H03K 17/693 |
| | | | | 327/581 |
| 12,341,332 B2 | * | 6/2025 | Djelassi-Tscheck | H02H 3/00 |
| 2012/0212077 A1 | * | 8/2012 | Lai | H02H 9/004 |
| | | | | 307/130 |
| 2019/0386480 A1 | * | 12/2019 | Mourrier | H02H 3/08 |
| 2021/0050708 A1 | * | 2/2021 | Yu | H04B 10/564 |
| 2023/0187922 A1 | | 6/2023 | Randazzo et al. | |
| 2025/0015796 A1 | * | 1/2025 | Djelassi-Tscheck | |
| | | | | H03K 17/223 |

* cited by examiner

*Primary Examiner* — Tuan T Lam
(74) *Attorney, Agent, or Firm* — Slater Matsil, LLP

(57) ABSTRACT

In accordance with an embodiment, a method includes: operating a driver circuit in an idle mode in which portion of the driver circuit are deactivated, wherein the driver circuit is coupled to a first transistor and a second transistor coupled between a supply node and a first circuit node configured to be connected to a load, and operating the driver circuit in the idle mode comprises the driver circuit switching off the first transistor, switching on the second transistor; detecting a change in a voltage across the first transistor; and in response to the change in voltage being detected, activating the inactive portions of the driver circuit to switch on the first transistor and leave the idle mode.

20 Claims, 4 Drawing Sheets

DRIVER CIRCUIT FOR CONTROLLING A SEMICONDUCTOR SWITCH

This application claims the benefit of German Patent Application No. DE102023109447.5, filed on Apr. 14, 2023, which application is hereby incorporated herein by reference.

TECHNICAL FIELD

The present description relates to the field of driver circuits for controlling a semiconductor switch.

BACKGROUND

Various types of semiconductor switches are known. For example, metal oxide semiconductor (MOS) field effect transistors (MOSFETs) are used in a variety of applications, for example in order to replace mechanical switches or fuses. One or more MOSFETs can be integrated into a semiconductor chip along with associated driver circuits, control logic, (current and temperature) sensor circuits, and other circuits. This is often referred to as intelligent semiconductor switches or smart switches.

In many applications, it is desirable or necessary to operate the control electronics needed to operate one or more MOSFETS in a special operating mode with a lower power consumption, which is often also called idle mode. In this idle mode, parts of the control electronics are inactive (e.g. switched off) in order to reduce the intrinsic power consumption of the control electronics. Nevertheless, the semiconductor switch can (or must) be switched on during the idle mode, i.e. control electronics must also be able to switch on a MOSFET, for example, or to keep it in the switched-on state in the idle mode, even if only a small load current flows through the MOSFET and the electrical load connected thereto. This can be important, for example, if an intelligent semiconductor switch is used as an electronic fuse.

A low intrinsic power consumption of all electrical components is particularly important in an automobile. An automobile can be parked for a relatively long time (several weeks). During this time, all electrical components are fed by the automobile battery, which is why the idle mode mentioned is implemented in many components in order to avoid discharging the battery too quickly. With known intelligent semiconductor switches, the intrinsic power consumption can be a few tens of microamperes per channel (i.e. per power MOSFET). An intrinsic power consumption of e.g. 50 µA may seem low, but since a very large number of switches are used in an automobile, the total power consumption can be significant.

There are concepts for reducing the intrinsic power consumption by deactivating the power MOSFET in the idle mode and the associated driver circuit, and instead activating a simple bypass switch. This bypass switch is designed for lower load currents (e.g. in the range of 10-500 mA) and is designed in such a way that it can be kept active by the control electronics with a low intrinsic power consumption. However, a problem can occur when the load connected to the switch is activated and the load current increases sharply. Due to the on-state resistance $R_{ON}$ of the bypass switch, a significant voltage drop across the bypass switch can occur even before the control electronics can change from the idle mode to the normal mode and can activate the power MOSFET which has a significantly lower on-state resistance. This (temporary) voltage drop across the bypass switch causes the supply voltage that is "seen" by the connected load (e.g. an electronic control unit, ECU) to fall. Such an undervoltage event can cause faults in the connected load.

SUMMARY

A circuit for controlling a transistor is described. According to one exemplary embodiment, the circuit comprises a first transistor which is connected between a supply connection and a first circuit node that can be connected to a load. The circuit further comprises a second transistor which is connected between the supply connection and the first circuit node, and a first circuit which is connected to the first circuit node and is designed to feed a current signal pulse into the first circuit node or to discharge it from the latter. A driver circuit for the first transistor is designed to operate in an idle mode in which parts of the driver circuit are inactive and therefore the first transistor is switched off and in which the second transistor (bypass transistor) is switched on, wherein the driver circuit is further designed to detect a change in the voltage across the first transistor that is caused by the current signal pulse in the idle mode and—if a change in the voltage is detected—to activate the inactive parts of the driver circuit in order to switch on the first transistor and leave the idle mode.

A further exemplary embodiment relates to a method comprising the following: operating a driver circuit for a first transistor in an idle mode in which a second transistor (bypass transistor) is switched on and parts of the driver circuit are deactivated, which is why the first transistor is switched off. The first transistor and the second transistor are connected between a supply node and a first circuit node, to which a load is connected. The method further comprises generating a current signal which is fed into or discharged from the first circuit node, and detecting a change in a voltage across the first transistor and—in response to a detection—activating the inactive parts of the driver circuit in order to switch on the first transistor and leave the idle mode.

BRIEF DESCRIPTION OF THE DRAWINGS

Exemplary embodiments are explained in more detail below with reference to figures. The illustrations are not necessarily true to scale, and the exemplary embodiments are not restricted just to the aspects that are illustrated. Rather, value is placed on illustrating the principles underlying the exemplary embodiments. With regard to the figures.

DETAILED DESCRIPTION OF THE EMBODIMENTS

Figure 1:
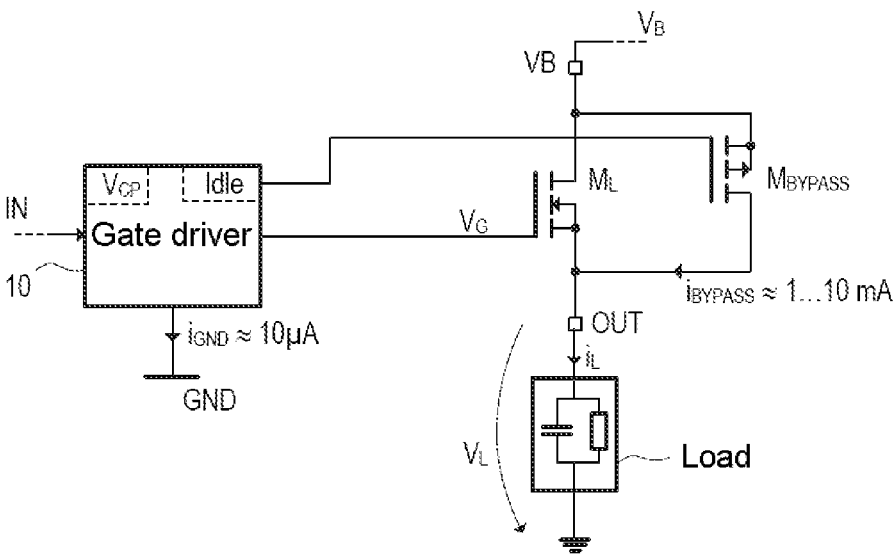
FIG. 1 shows an example of a driver circuit for controlling a power transistor and a bypass transistor, which takes over the current of the power transistor when the driver circuit is in the idle mode.

The example illustrated in FIG. 1 may be part of an intelligent semiconductor switch. This is however not necessarily the case. The transistors and associated control electronics can also be arranged in separate integrated circuits (ICs).

FIG. 1 shows a gate driver circuit 10 which can be operated at least in a normal mode and in an idle mode. The driver circuit 10 is designed to switch on the power transistor $M_L$ in the normal mode and to keep it in the switched-on state. Switching-on is indicated by the input signal IN (a logic signal). In the idle mode, parts of the driver circuit 10 are inactive, in particular those parts which are needed to control the gate of the power transistor $M_L$. Instead, the (smaller) bypass transistor $M_{BYPASS}$ is switched on in order to supply the load.

An n-channel MOSFET is often used as the power transistor. In a high-side configuration, this means that the driver circuit 10 must have a charge pump or the like in order to generate the voltage $V_{CP}$ needed to switch on the power transistor. The charge pump (and also other components of the gate driver for the power transistor) cause high intrinsic power consumption, which is why these components are deactivated in the idle mode. A p-channel MOSFET that does not require a charge pump or the like in a high-side configuration can be used as the bypass transistor $M_{BYPASS}$. The drain-source current paths (load current paths) of the power transistor $M_L$ and the bypass transistor $M_{BYPASS}$ are connected in parallel. In the example from FIG. 1, the power transistor $M_L$ is an n-channel transistor as mentioned and the bypass transistor $M_{BYPASS}$ is a p-channel transistor. The use of a bypass transistor results in a lower intrinsic power consumption of the driver circuit 10 in the idle mode. In FIG. 1, the intrinsic power consumption of the driver circuit 10 is represented by the current $i_{GND}$ which flows from the driver circuit 10 to a ground node GND. The charge pump mentioned can be considered to be part of the driver circuit and is indicated in the figures with the symbol $V_{CP}$. The output voltage of the charge pump may be higher than the supply voltage $V_B$, but is not available in the idle mode to supply those components which are needed to switch on the power transistor $M_L$.

In the example illustrated, the load current paths of the transistors $M_L$ and $M_{BYPASS}$ connect the connection VB and the connection OUT. During operation, a supply voltage $V_B$ is present at the connection VB. The load is connected to the connection OUT, wherein the load current $i_L$ flows from the connection OUT through the load to a ground node GND (reference potential). The power transistor $M_L$ and the bypass transistor $M_{BYPASS}$ thus together form a high-side switch. The load "sees", as the supply voltage, the voltage $V_L$ which is available at the connection OUT.

Figure 2:
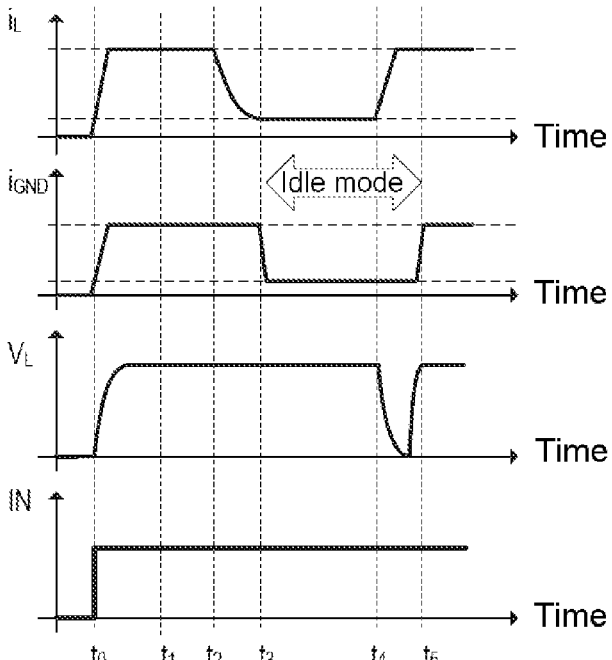
FIG. 2 illustrates the function of the circuit from FIG. 1 using timing diagrams.

When the power transistor $M_L$ is switched on, the voltage drop across the high-side switch is only a few millivolts and $V_L \approx V_B$ applies to all relevant practical applications. This applies in the idle mode, in which the power transistor $M_L$ is off, only as long as the load current $i_L$ is low. In the event of a sudden increase in the load current $i_L$, the voltage $V_L$ may drop in the idle mode because a high load current $i_L$ can cause a significant voltage drop across the bypass transistor. A (temporary) drop in the voltage $V_L$ can trigger an undesirable undervoltage event in the load. This is illustrated in FIG. 2.

The timing diagrams show an example of a change of the driver circuit from the normal mode to the idle mode and back to the normal mode. At the time $t_1$, the driver circuit is in the normal operating mode after (at the time $t_0$) the logic signal IN has triggered a switch-on of the power transistor $M_L$. The voltage $V_L$ at the output OUT corresponds approximately to the supply voltage $V_B$ and the load current $i_L$ is comparatively high. The intrinsic power consumption $i_{GND}$ is also comparatively high. Later, at the time $t_2$, the load current $i_L$ begins to decrease, which means that, at the time $t_3$, the driver circuit 10 changes to the idle mode. This means that the bypass transistor $M_{BYPASS}$ is activated, and the power transistor $M_L$ switches off when the driver circuit changes to the idle mode. As illustrated in FIG. 2, the intrinsic power consumption $i_{GND}$ of the driver circuit in the idle mode is significantly lower than in normal operation.

During operation of the driver circuit 10 in the idle mode—at the time $t_4$—the load suddenly requires more current and the load current it increases abruptly. Since the load current $i_L$ can only flow through the bypass transistor $M_{BYPASS}$ at this time, the voltage drop $R_{ON} \cdot i_L$ across the bypass transistor $M_{BYPASS}$ leads to a drop in the output voltage $V_L$ ($V_L = V_B - R_{ON} \cdot i_L$), since the on-state resistance $R_{ON}$ of the bypass transistor $M_{BYPASS}$ is much higher than that of the power transistor $M_L$.

At the time $t_5$, the driver circuit has left the idle mode, changed back to the normal operating mode, and switched the power transistor $M_L$ on again. The load current $i_L$ flows essentially through the power transistor $M_L$ and, since the on-state resistance resistance of the power transistor $M_L$ is much lower than the on-state resistance $R_{ON}$ of the bypass transistor $M_{BYPASS}$, the output voltage $V_L$ rises again ($V_L \approx V_B$).

The temporary drop in the output voltage $V_L$ can cause a variety of problems. For example, the load can detect the undervoltage event, shut down, and try to restart, resulting in the same problem (undervoltage). In this way, the load can get stuck in an endless loop.

As a rule, the increase in the load current $i_L$ illustrated in FIG. 2 does not happen randomly during the idle mode of the driver circuit. It is generally known beforehand that more load current will flow in the near future, for example because the load is intentionally activated (for example, ventilation can be switched on). The exemplary embodiments described below offer the load a simple possible way of "waking up" the driver circuit from the idle mode and—for example with a short current pulse of a defined height—announcing to the driver circuit that more load current will be required in the near future and that it should leave the idle mode. A simple example is illustrated in FIG. 3.

Figure 3:
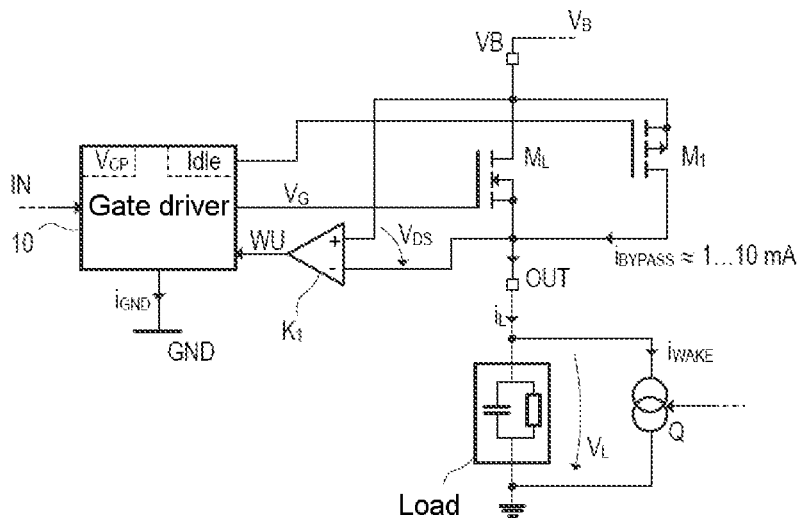
FIG. 3 shows an example of a driver circuit for controlling a power transistor and a bypass transistor, which takes over the current of the power transistor when the driver circuit is in the idle mode, wherein a current pulse at the output node can be used to signal to the driver circuit to leave the idle mode.

FIG. 3 shows a gate driver circuit 10 which is similar in structure to the driver circuit from FIG. 1. It can be operated at least in a normal mode and in an idle mode. The driver circuit 10 is designed to switch on the power transistor $M_L$ in the normal mode according to the logic signal IN and to keep it in the switched-on state. In the idle mode, parts of the driver circuit 10 are inactive, in particular those parts which are needed to control the gate of the power transistor $M_L$. Instead, the (smaller) bypass transistor $M_1$ is switched on in order to supply the load. The drain-source current paths (load current paths) of the power transistor $M_L$ and the bypass transistor $M_1$ are connected in parallel. With regard to the bypass transistor $M_1$, reference is made to the corresponding explanations of FIG. 1.

As illustrated in FIG. 3, a controlled current source Q is connected to the output node OUT. The current source can be controlled (by a controller not illustrated in FIG. 3) and is designed to generate a short current pulse $i_{WAKE}$ of defined amplitude. This current pulse is superimposed on the normal load current, which is relatively small in the idle mode of the driver circuit, and results in a change in the voltage drop $V_{DS}$ across the load current paths of the power transistor $M_L$ and the bypass transistor $M_1$. This change $\Delta V_{DS}$ equals $i_{WAKE} \cdot R_{ON}$, where $R_{ON}$ denotes the on-state resistance of the bypass transistor $M_1$ (the power transistor is off in the idle mode).

The change $\Delta V_{DS}$ in the voltage $V_{DS}$ that is caused by the current pulse $i_{WAKE}$ can be detected by means of the comparator $K_1$. If the comparator $K_1$ detects such a change in the voltage $V_{DS}$, this is indicated at the comparator output by a corresponding signal level of the wakeup signal WU. Depending on the signal level of the wakeup signal, the inactive parts of the driver circuit are reactivated in order to leave the idle mode, return to the normal operating mode and switch on the power transistor $M_L$. Generating the current pulse $i_{WAKE}$ thus makes it possible to actively wake up the driver circuit 10 and bring it back from the idle mode to the normal operating mode, even before the load requires a higher load current.

The comparator $K_1$ is considered to be part of the driver circuit 10. In the figures, the current source Q and the comparator $K_1$ are illustrated as separate components in order to highlight their function and to avoid complicating the illustration unnecessarily. The current source can be controlled, for example, by a microcontroller or another controller to generate the current pulse. The current source Q can also (but does not have to) be part of the load.

However, this current source Q is not absolutely necessary. In some exemplary embodiments, a circuit is connected to the output node OUT and is designed to generate a current signal that has a similar effect to the aforementioned current pulse $i_{WAKE}$. For example, this circuit can be the load itself or can be contained in the load. For example, the load may have a characteristic inrush current characteristic during switch-on or activation (e.g. when leaving a quiescent state), according to which the inrush current is initially comparatively small (for a certain time and before the load current reaches its final value), but large enough to cause a change $\Delta V_{DS}$ that can be detected by the comparator $K_1$ in order to generate the wakeup signal WU and wake up the driver circuit.

Figure 4:
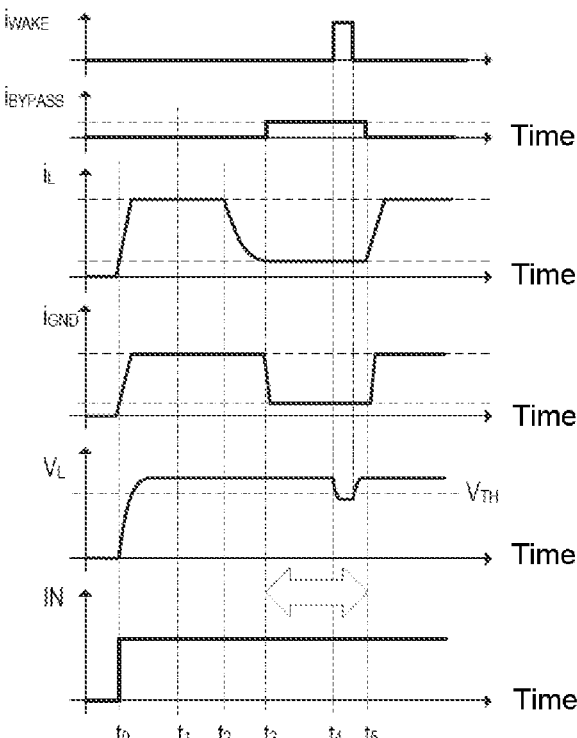
FIG. 4 illustrates the function of the circuit from FIG. 3 using timing diagrams.

The process described above is illustrated again by way of example using the timing diagrams illustrated in FIG. 4. At the time $t_0$, the logic signal IN causes the power transistor $M_L$ to be switched on. Then—at the time $t_1$—the driver circuit is in the normal operating mode. The voltage $V_L$ at the output OUT corresponds approximately to the supply voltage $V_B$ and the load current it is comparatively high. The intrinsic power consumption $i_{GND}$ is also comparatively high. Later—at the time $t_2$—the load current it begins to decrease, which means that, at the time $t_3$, the driver circuit 10 changes to the idle mode. This means that the bypass transistor $M_1$ is activated, and the power transistor $M_L$ switches off when the driver circuit changes to the idle mode. The bypass transistor takes over the load current $i_L$. The intrinsic power consumption $i_{GND}$ of the driver circuit drops significantly after the transition to the idle mode.

During operation of the driver circuit 10 in the idle mode—at the time $t_4$—the current source Q (e.g. prompted by a controller not described in any more detail here) generates a current pulse $i_{WAKE}$. Alternatively, as described above, a current signal generated by the load or a circuit contained in the latter may have a similar effect. The current pulse or current signal causes a change in the drain-source voltage $V_{DS}$ across the transistors $M_L$ and $M_1$. The change $\Delta V_{DS}$ in the voltage $V_{DS}$ is $R_{ON} \cdot i_{WAKE}$, where $R_{ON}$ denotes the on-state resistance of the bypass transistor and $i_{WAKE}$ here denotes the amplitude of the current pulse. The voltage change $\Delta V_{DS}$ is large enough that it can be detected by means of a comparator. The comparator compares the drain-source voltage $V_{DS}$ with a threshold value $V_{TH1}$ and signals (wakeup signal WU, see FIG. 3) when the voltage $V_{DS}$ falls below the threshold value $V_{TH1}$. However, the amplitude of the current pulse $i_{WAKE}$ is designed in such a way that the resulting voltage change $\Delta V_{DS}$ remains small enough that the operation of the connected load is not disturbed and in particular no undervoltage events are caused in the connected loads. The wakeup signal WU causes the driver circuit (time $t_5$) to leave the idle mode and to switch the power transistor $M_L$ on again. A significant drop in the output voltage $V_L$, as in the example from FIG. 2, is avoided.

Figure 5:
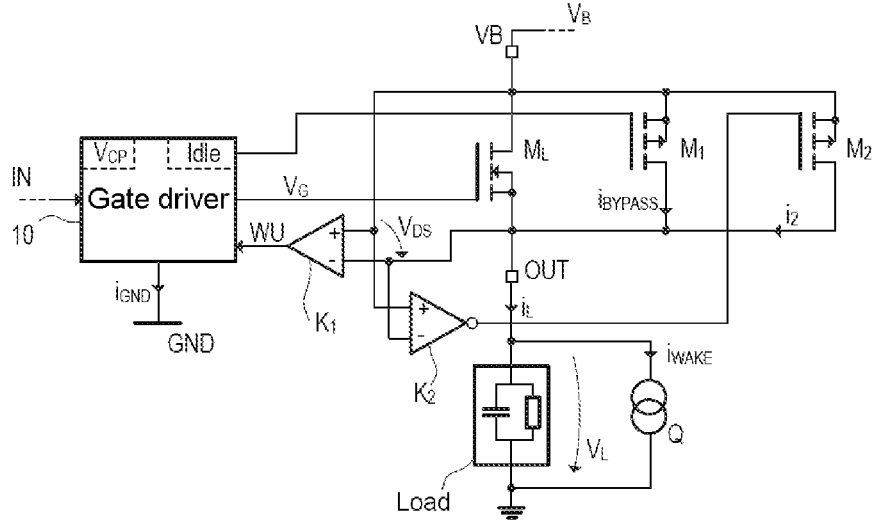
FIGS. 5, 6 and 7 show various modifications/extensions of the exemplary embodiment from FIG. 4.
Figure 6:
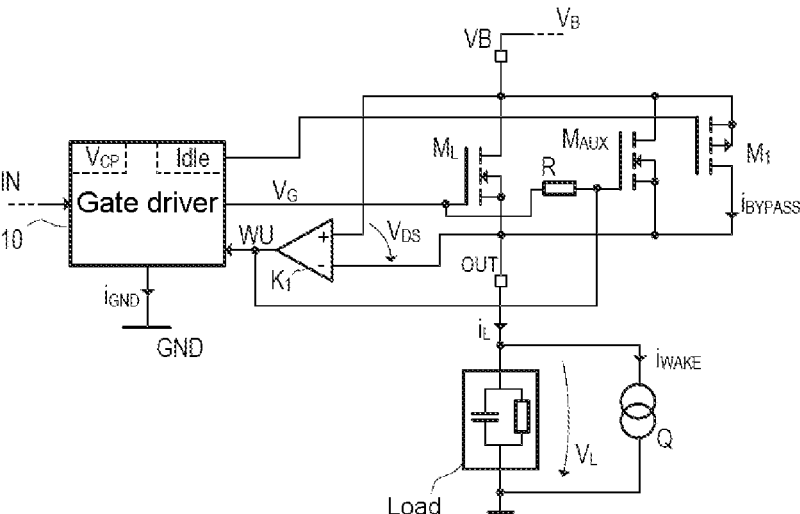
Figure 7:
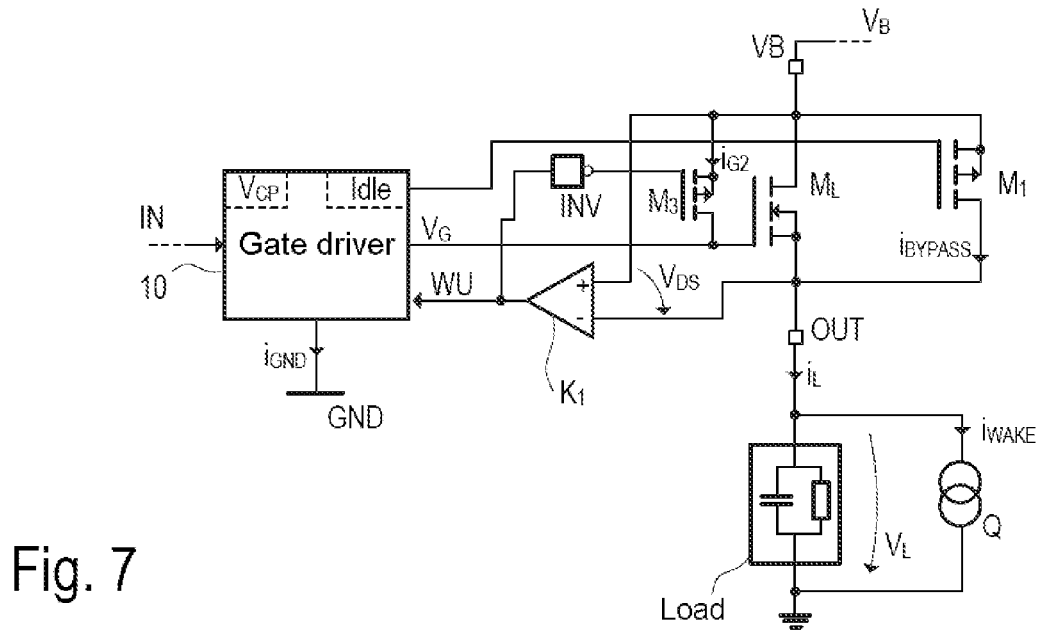

FIGS. 5, 6 and 7 show modifications and extensions of the example from FIG. 3. The modifications/extensions are primarily aimed at accelerating the switching-on of the power transistor $M_L$ in response to the current pulse $i_{WAKE}$, in order to enable a rapid increase in the load current without obtaining the negative effect regarding undervoltage described at the outset.

The example from FIG. 5 essentially corresponds to the circuit from FIG. 3, but, in addition to the (first) bypass transistor $M_1$, a further (second) bypass transistor $M_2$ is used. The drain-source current path of the second bypass transistor $M_2$ is connected in parallel with the drain-source current path of the power transistor $M_L$. The gate electrode of the second bypass transistor $M_2$ is connected to the (inverting) output of a further comparator $K_2$ which—like the comparator $K_1$—is designed to compare the drain-source voltage $V_{DS}$ with a threshold value in order to detect a change (in particular an increase) in the drain-source voltage $V_{DS}$. The comparator $K_2$ uses a threshold value $V_{TH2}$ that is lower than the threshold value $V_{TH1}$ used by the first comparator $K_1$. For example, the threshold value $V_{TH1}$ can be two volts, whereas the threshold value $V_{TH2}$ is only one volt. It goes without saying that the numerical values mentioned are only illustrative examples and strongly depend on the actual application. Both bypass transistors $M_1$ and $M_2$ are p-channel MOSFETs in the example illustrated.

If the drain-source voltage $V_{DS}$ increases, the output of the second comparator $K_2$ will thus first detect the voltage change $\Delta V_{DS}$ and control the gate of the second bypass transistor $M_2$. Activating the second bypass transistor $M_2$ means that the effective on-state resistance $R_{ON}$ decreases, since the on-state resistances of the two bypass transistors $M_1$ and $M_2$ are connected in parallel. Whereas a current of the order of a few milliamperes can flow through the first bypass transistor $M_1$ in the idle mode, the load current $i_L$ can be of the order of one ampere when the second bypass transistor $M_2$ is activated.

If the voltage $V_{DS}$ continues to increase after the activation of the second bypass transistor $M_2$ and reaches or exceeds the threshold value $V_{TH1}$ of the first comparator $K_1$, then the wakeup signal WU at the output of the first comparator $K_1$ signals to the gate driver circuit to leave the idle mode and switch on the power transistor $M_L$. This mechanism has already been explained with reference to FIGS. 3 and 4 and reference is made to the above description. In any case, the current pulse $i_{WAKE}$ must be dimensioned such that, even with the second bypass transistor $M_2$ activated, the resulting voltage change $\Delta V_{DS}$ is large enough to satisfy the condition $V_{DS} > V_{TH1}$ and actually wake up the driver circuit 10.

The example from FIG. 6 is a modification of the example from FIG. 3, wherein, in addition to the bypass transistor $M_1$, use is made of a further transistor $M_{AUX}$ which is referred to as an auxiliary transistor and is of the same type as the power transistor $M_L$. In the examples described here, the power transistor $M_L$ is an n-channel MOSFET and consequently the transistor $M_{AUX}$ is also an n-channel MOS-FET. The drain-source current paths of the transistors $M_L$ and $M_{AUX}$ are connected in parallel. In one exemplary embodiment, the power transistor $M_L$ is constructed from a multiplicity of transistor cells which are arranged in a so-called transistor cell array.

According to some exemplary embodiments, the power transistor $M_L$ is a DMOS field effect transistor. For example, the transistor $M_{AUX}$ may be integrated in the same transistor cell array as the power transistor $M_L$, but the two transistors $M_L$ and $M_{AUX}$ have separate gate electrodes which are connected via an ohmic resistor R. However, the transistor $M_{AUX}$ has a much smaller active area (i.e. fewer transistor cells) than the power transistor $M_L$, which is why the gate-source capacitance of the transistor $M_{AUX}$ that is typical of MOSFETs is much smaller than that of the power transistor $M_L$.

The gate electrode of the transistor $M_{AUX}$ is connected to the output of the comparator $K_1$. In the example illustrated, the gate electrode of the transistor $M_{AUX}$ is connected to the output of the comparator $K_1$ directly, that is to say by means of a low-impedance line. As a result—if the comparator $K_1$ detects a voltage change $\Delta V_{DS}$ (i.e. $V_{DS} > V_{TH1}$)—the gate electrode of the transistor $M_{AUX}$ is already pre-charged and consequently the transistor $M_{AUX}$ becomes conductive, even if it does not reach its minimum on-state resistance at this time. The gate-source voltage $V_{GS}$ of the transistor $M_{AUX}$ can be charged in this manner to a voltage value that approximately corresponds to the value $V_{TH1}$ ($V_{GS} \approx V_{DS} \approx V_{TH1}$).

The resistor R prevents significant charging of the gate-source capacitance of the power transistor $M_L$ during the process of switching on the transistor $M_{AUX}$. When the power transistor $M_L$ is fully switched on in the normal operating mode, the resistor R ensures that both transistors $M_L$ and $M_{AUX}$ are charged to the same gate voltage. However, the resistor R is not absolutely necessary. In other exemplary embodiments, the transistors $M_L$ and $M_{AUX}$ can be controlled independently of each other.

Apart from the additional transistor $M_{AUX}$, the circuit from FIG. 6 is the same as that from FIG. 3 and reference is made to the relevant explanations further above. The effect of the transistor $M_{AUX}$ directly controlled by the comparator $K_1$ is similar to that of the second bypass transistor $M_2$ in the example from FIG. 5. If the comparator $K_1$ detects a voltage change $\Delta V_{DS}$ (i.e. $V_{DS} > V_{TH1}$), then the transistor $M_{AUX}$ is very quickly brought into a conductive state, which reduces the total on-state resistance (parallel connection of the on-state resistances of $M_{AUX}$ and $M_1$), even before the driver circuit switches on the power transistor $M_L$ a short time later (after the change from the idle mode to the normal mode has been completed). The reduction in the (total) on-state resistance prevents the voltage $V_{DS}$ from rising too much and consequently the output voltage $V_L$ from dropping too much.

The example from FIG. 7 is a modification of the example from FIG. 3, wherein, instead of a second bypass transistor (as in the example from FIG. 6), use is made of a further transistor $M_3$ which is connected between the supply node $V_B$ (supply voltage $V_B$) and the gate electrode of the power transistor $M_L$. This means that the source-drain current path of the transistor $M_3$ connects the gate electrode of the power transistor $M_L$ to the supply voltage $V_B$ when the transistor $M_3$ is switched on. The gate electrode of the transistor $M_3$ is connected to the output of the comparator $K_1$, in particular directly via a low-impedance line.

The effect of the additional transistor $M_3$ controlled by the comparator $K_1$ is similar to that of the auxiliary transistor $M_{AUX}$ in the example from FIG. 6. In the example illustrated, the output signal from the comparator $K_1$ is inverted (inverter INV), since $M_3$ is a p-channel transistor. If the comparator $K_1$ detects a voltage change $\Delta V_{DS}$ (i.e. $V_{DS} > V_{TH1}$), then the transistor $M_3$ is very quickly brought into a conductive state, which leads to the gate electrode of the power transistor $M_L$ being pre-charged via the source-drain current path of the transistor $M_3$. This means that the gate-source voltage of the power transistor $M_L$ is charged at least to a voltage value that corresponds approximately to the threshold value $V_{TH1}$ of the comparator $K_1$. This is enough to put the power transistor $M_L$ into a conductive state, even if it does not yet reach its minimum on-state resistance. As in the previous example, this reduces the total on-state resistance (of both transistors $M_L$ and $M_1$) even before the driver circuit fully switches on the power transistor $M_L$ a short time later (after the change from the idle mode to the normal mode has been completed). The mentioned reduction in the (total) on-state resistance prevents the voltage $V_{DS}$ from rising too much and consequently prevents the output voltage $V_L$ from dropping too much as long as the driver circuit is not yet operating in the normal operating mode.

It is understood that, in the examples from FIGS. 6 and 7, two separate comparators can also be used (in a similar manner to FIG. 5) to generate the wakeup signal WU and control the transistor $M_{AUX}$ and $M_3$, respectively, in order to be able to use different threshold values to generate the wakeup signal WU and activate the transistor $M_{AUX}$ and $M_3$, respectively. Furthermore, it should be pointed out that the MOS transistors $M_1$, $M_2$ and $M_3$ (in particular the transistor $M_3$ from FIG. 7) shown in the figures can also be replaced by other transistor types such as bipolar transistors.

The exemplary embodiments described here are briefly summarized below. It is understood that the following is not an exhaustive list, but merely an exemplary summary.

One exemplary embodiment relates to a control circuit for a semiconductor switch. The circuit comprises a first transistor (see FIGS. 3 and 4-7, power transistor $M_L$) which is connected between a supply connection and an output node (see FIGS. 3 and 4-7, supply connection VB, output node OUT). The latter can be connected to a load. The circuit further comprises a second transistor (see FIGS. 3 and 4-7, bypass transistor $M_1$) which is also connected between the supply connection and the output node. A first circuit is connected to the output node and is designed to feed a current signal (see e.g. FIG. 4, current pulse $i_{WAKE}$) into the output node (source) or to discharge it from the latter (sink). The circuit further comprises a driver circuit for the first transistor, which is designed to operate in an idle mode in which parts of the driver circuit are inactive and therefore the first transistor is switched off and in which the second transistor is switched on (cf. timing diagram in FIG. 4). The driver circuit is further designed to detect a change $\Delta V_{DS}$ in the voltage $V_{DS}$ across the first transistor that is caused by the current signal in the idle mode and, if a change in the voltage is detected, to (re-)activate the inactive parts of the driver circuit in order to switch on the first transistor (again) and leave the idle mode.

The current signal can be a current pulse of defined amplitude and defined duration. This can be generated, for example, by means of a controlled current source. In some applications, the load has a characteristic inrush current characteristic that is sufficient to cause the necessary change $\Delta V_{DS}$ in the voltage $V_{DS}$. The first circuit is not part of the driver circuit and may be in particular a separate component (e.g. part of a higher-level controller) or part of the connected load. In one exemplary embodiment, the first circuit is or comprises a controllable current source.

According to one exemplary embodiment, the first transistor may be an n-channel transistor and the second transistor may be a p-channel transistor (cf. FIG. 3). The first transistor can be a MOSFET, in particular a DMOS power transistor. Alternatively, the first transistor can also be implemented as an SiC-FET (silicon carbide FET), a bipolar transistor or a transistor of another transistor type. Even the second transistor is not necessarily a field effect transistor. For example, the bypass transistor $M_1$ in the examples from FIGS. 3 and 5-7 could also be implemented as a pnp bipolar transistor.

In one exemplary embodiment, the circuit has a first comparator (see FIGS. 3 and 5-7, comparator $K_1$) which is designed to detect that the voltage across the first transistor reaches a first threshold value. The driver circuit is designed to leave the idle mode when an output of the first comparator indicates that the voltage across the first transistor has reached the first threshold value. The first comparator can be part of the driver circuit.

In one exemplary embodiment, the circuit has a second comparator (see FIG. 5, comparator $K_2$) which is designed to detect that the voltage across the first transistor reaches a second threshold value. In this example, the circuit further has a third transistor (see FIG. 5, further bypass transistor $M_2$) which is also connected between the supply connection and the first output node. The control electrode of the third transistor is connected to an output of the second comparator. The third transistor may be of the same transistor type as the second transistor, for example a p-channel MOSFET, a pnp bipolar transistor, or comparable transistor types.

In another exemplary embodiment, the circuit comprises a fourth transistor (see FIG. 4, $M_{AUX}$) which is also connected between the supply connection and the output node. The driver circuit is designed to switch on the fourth transistor when a change in the voltage is detected, wherein the fourth transistor has a control electrode which is coupled to a control electrode of the first transistor via a resistor. The first transistor and the fourth transistor can be integrated in the same transistor cell array. The control electrode of the fourth transistor can be controlled on the basis of the output signal from the first comparator or another comparator.

In a further exemplary embodiment, a fifth transistor is provided and is connected between the supply connection and a control electrode (gate electrode) of the first transistor. The driver circuit is designed to switch on the fifth transistor when a change in the voltage is detected (cf. FIG. 7). The control electrode of the fifth transistor can be controlled on the basis of the output signal from the first comparator or another comparator.

A further exemplary embodiment relates to a method for controlling a power transistor. The method comprises operating a driver circuit for a first transistor (see e.g. FIGS. 3 and 5-7, power transistor $M_L$) in an idle mode in which a second transistor (see e.g. FIGS. 3 and 5-7, bypass transistor $M_1$) is switched on and parts of the driver circuit are deactivated, which is why the first transistor is switched off. The first transistor and the second transistor are both connected between a supply node and an output node, to which a load is connected. The method further comprises generating a current signal (e.g. current pulse) which is fed into or discharged from the output node, and detecting a change $\Delta V_{DS}$ in a voltage $V_{DS}$ across the first transistor and, in response to the detection, activating the inactive parts of the driver circuit in order to switch on the first transistor and leave the idle mode.

It is understood that only those components which are needed to explain the exemplary embodiments are illustrated in the circuits illustrated here. A person skilled in the art will easily be able to implement specific circuits based on the examples shown in the figures. It is also understood that the examples shown in the figures can be easily modified without significantly changing the function. This means that a person skilled the art can implement the function effected by the examples shown in the figures with other circuits that are functionally equivalent and are covered by the scope of protection of the patent claims. Based on the examples illustrated, the polarity of logic signals can be inverted, for example. The polarity of the current signal $i_{WAKE}$ can also be inverted, which means that the threshold values of the comparators illustrated in the figures must be adjusted. Comparators with or without hysteresis can be used. Furthermore, the examples illustrated are not necessarily alternatives, but can be combined. The driver circuit and the power transistor can be integrated in a chip to form an "intelligent" semiconductor switch. Alternatively, the power transistor can be integrated in a separate chip. The bypass transistor may also be included in the driver circuit. The specific implementation will depend heavily on the desired application.

The invention claimed is:

1. A circuit, comprising:
a first transistor coupled between a supply connection and a first circuit node configured to be connected to a load;
a second transistor coupled between the supply connection and the first circuit node;
a first circuit coupled to the first circuit node and configured to feed a current signal into the first circuit node or to discharge the current signal from the first circuit node;
a third transistor coupled between the supply connection and the first circuit node; and
a driver circuit coupled to the first transistor, the driver circuit configured to:
operate in an idle mode, in which portions of the driver circuit are inactive,
switch off the first transistor and switch on the second transistor while operating in the idle mode, and
detect a change in a voltage across the first transistor caused by the current signal in the idle mode,
activate the inactive portions of the driver circuit, switch on the first transistor, and leave the idle mode in response to the change in voltage being detected,
detect that a voltage across the first transistor reaches a second threshold value, and
turn on the third transistor in response to detecting that the voltage across the first transistor reaches the second threshold value.

2. The circuit as claimed in claim 1, wherein the first circuit comprises a controllable current source.

3. The circuit as claimed in claim 1, wherein the current signal comprises a current pulse with a defined amplitude.

4. The circuit as claimed in claim 1, wherein the first transistor is an n-channel field effect transistor and the second transistor is a p-channel field effect transistor.

5. The circuit as claimed in claim 1, further comprising:
a first comparator configured to detect that the voltage across the first transistor reaches a first threshold value, wherein the driver circuit is further configured to leave the idle mode in response to an output of the first comparator indicating that the voltage across the first transistor has reached the first threshold value.

6. The circuit as claimed in claim 1, further comprising: a second comparator configured to detect that the voltage across the first transistor reaches the second threshold value, wherein a control electrode of the third transistor is coupled to an output of the second comparator.

7. The circuit as claimed in claim 6, wherein the third transistor is a p-channel field effect transistor.

8. The circuit as claimed in claim 1, further comprising a fourth transistor coupled between the supply connection and the first circuit node, wherein the driver circuit is configured to switch on the fourth transistor in response to the change in the voltage being detected.

9. The circuit as claimed in claim 8, wherein the fourth transistor comprises a control electrode coupled to a control electrode of the first transistor via a resistor.

10. The circuit as claimed in claim 8, wherein the first transistor and the fourth transistor are integrated in a same transistor cell array.

11. The circuit as claimed in claim 1, further comprising a fifth transistor coupled between the supply connection and a control electrode of the first transistor, wherein the driver circuit is designed to switch on the fifth transistor in response to the change in the voltage being detected.

12. The circuit as claimed in claim 1, wherein the first circuit is not part of the driver circuit.

13. A method, comprising:
operating a driver circuit in an idle mode in which portions of the driver circuit are inactive, wherein the driver circuit is coupled to a first transistor and a second transistor coupled between a supply node and a first circuit node configured to be connected to a load, and operating the driver circuit in the idle mode comprises the driver circuit switching off the first transistor, switching on the second transistor;
generating a current signal;
feeding the current signal into the first circuit node or discharging the current signal from the first circuit node;
detecting a change in a voltage across the first transistor;
in response to the change in voltage being detected, activating inactive portions of the driver circuit to switch on the first transistor and leave the idle mode;
detecting that a voltage across the first transistor reaches a second threshold value; and
turning on a third transistor coupled between the supply node and the first circuit node in response to detecting that the voltage across the first transistor reaches the second threshold value.

14. The method of claim 13, further comprising:
detecting that a voltage across the first transistor reaches a first threshold value; and
leaving the idle mode in response to detecting that the voltage across the first transistor reaches the first threshold value.

15. The method of claim 13, further comprising:
turning on a fifth transistor coupled between the supply node and a control electrode of the first transistor in response to the change in voltage being detected.

16. A circuit, comprising:
a gate driver circuit comprising:
    a charge pump configured to be active during a normal operating mode and inactive during an idle mode,
    a first output configured to activate a first transistor using an output of the charge pump during the normal operating mode, and deactivate the first transistor during the idle mode,
    a second output configured to deactivate a second transistor during the normal operating mode and activate the second transistor during the idle mode,
    a third output configured to activate and deactivate a third transistor,
    a first comparator input port configured to be coupled to an output of a first comparator configured to compare a voltage across the first transistor to a first threshold,
    a second comparator input port configured to be coupled to an output of a second comparator configured to compare a voltage across the first transistor to a second threshold, and
    a logic circuit configured to:
        transition the gate driver circuit from the idle mode to the normal operating mode in response to a signal at the first comparator input port indicating that the voltage across the first transistor has crossed the first threshold, and
        activate the third transistor in response to a signal at the second comparator input port indicating that the voltage across the first transistor has crossed the second threshold.

17. The circuit of claim 16, further comprising:
the first transistor having a load path coupled between a power supply node and a first node configured to be coupled to a load, and a control input coupled to the first output;
the second transistor having a load path coupled between the power supply node and the first node, and a control node coupled to the second output; and
the first comparator having inputs coupled across the load path of the first transistor.

18. The circuit of claim 17, wherein:
the first transistor is an n-channel transistor; and
the second transistor is a p-channel transistor.

19. The circuit of claim 17, further comprising a controllable current source having an output coupled to the first node, wherein the controllable current source is configured to produce a current signal configured to cause the gate driver circuit to exit the idle mode by activating the first comparator.

20. The circuit of claim 17, further comprising the third transistor having a load path coupled between the power supply node and the first node, and a control node coupled to the third output.

* * * * *